United States Patent [19]
Yanagida et al.

[11] Patent Number: 5,115,300
[45] Date of Patent: May 19, 1992

[54] HIGH-POWER SEMICONDUCTOR DEVICE

[75] Inventors: Shingo Yanagida, Yokohama; Tetsujiro Tsunoda, Fujisawa, both of Japan

[73] Assignee: Kabushiki Kaisha Toshiba, Kawasaki, Japan

[21] Appl. No.: 622,591

[22] Filed: Dec. 5, 1990

[30] Foreign Application Priority Data

Dec. 7, 1989 [JP] Japan .................................. 1-318153

[51] Int. Cl.⁵ ...................... H01L 23/16; H01L 39/02; H01L 49/00
[52] U.S. Cl. ........................................ 357/75; 357/80; 357/85
[58] Field of Search ..................... 357/75, 80, 85, 74, 357/23.1, 81

[56] References Cited

U.S. PATENT DOCUMENTS 4,818,895 4/1989 Kaufman .............................. 357/75

Primary Examiner—Andrew J. James
Assistant Examiner—Carl Whitehead
Attorney, Agent, or Firm—Finnegan, Henderson, Farabow, Garrett and Dunner

[57] ABSTRACT

A high-power semiconductor device comprises a overcurrent detecting terminal. One of conductive layers selectively adhered to a substrate of the semiconductor device is thinner than the other conductive layers. One of terminals for an electrode of the semiconductor element of the high-power semiconductor device is connected to one end of the thinner conductive layer. The overcurrent detecting terminal is electrically connected to said electrode, and to the other end of the thinner conductive layer. A potential difference between the terminal and the overcurrent detecting terminal is measured, in order to detect a current, to prevent an overcurrent from flowing through the semiconductor element.

12 Claims, 4 Drawing Sheets

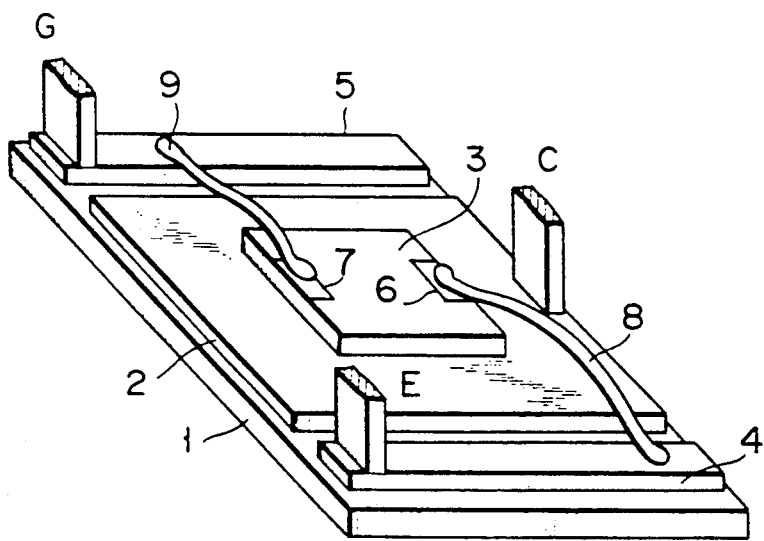
FIG. 1A (PRIOR ART)
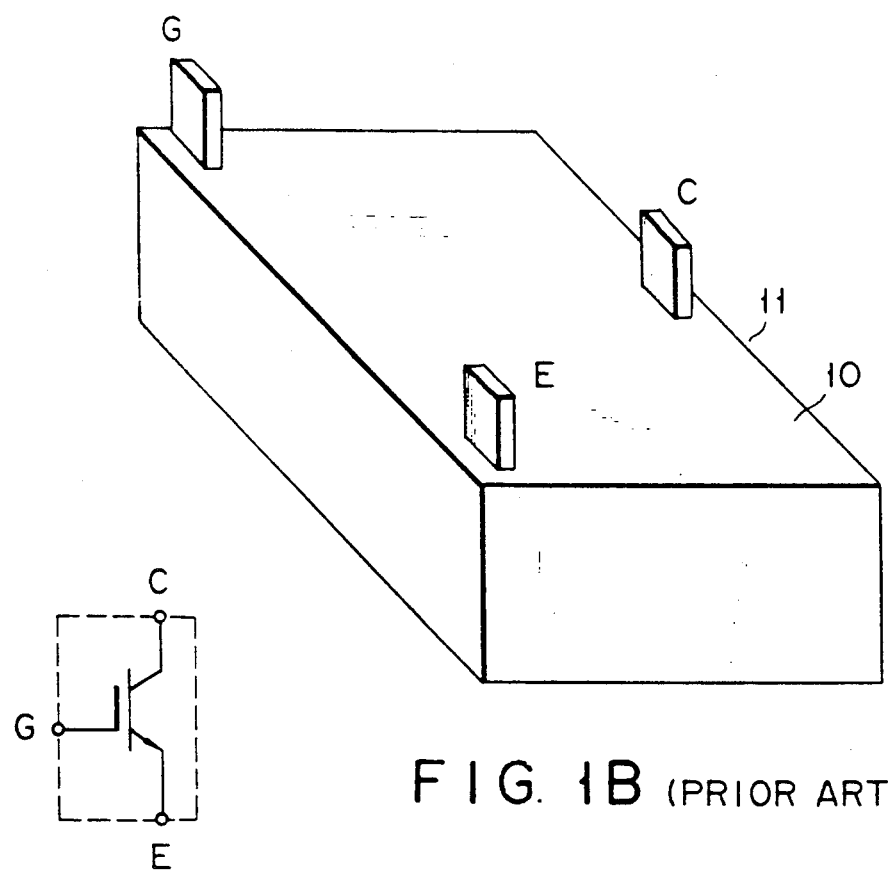
FIG. 1B (PRIOR ART)
FIG. 1C (PRIOR ART)

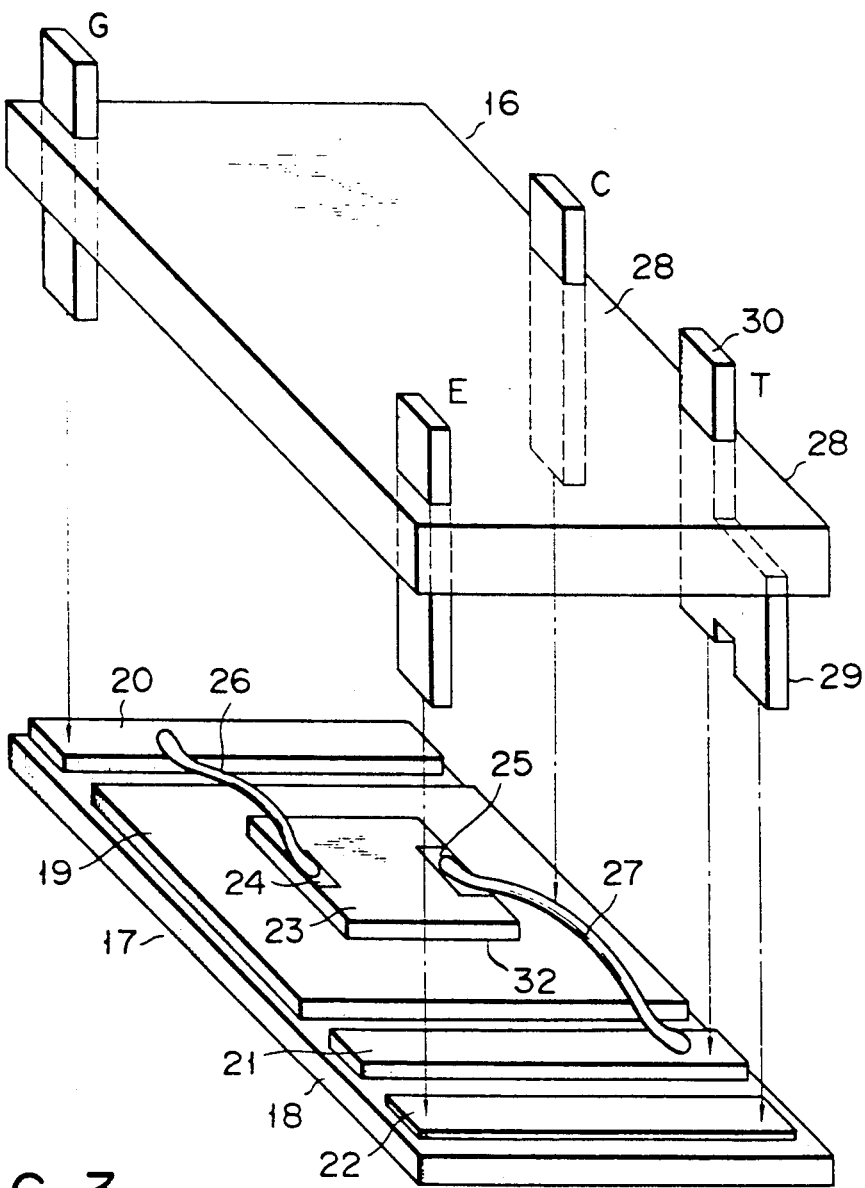
F I G. 3

HIGH-POWER SEMICONDUCTOR DEVICE

BACKGROUND OF THE INVENTION

1. Field of the Invention

This invention relates to a high-power semiconductor device sealed within resin, and more particularly to a high-power semiconductor device which can generate an overcurrent detecting signal, requiring no external elements.

2. Description of the Related Art

A conventional high power semiconductor device will be described with reference to FIGS. 1A, 1B, and 1C. The rated current of the device is several amperes and more.

As shown in FIG. 1A, a conductive layer, for example, copper plate 2 is adhered to the surface of insulating substrate 1. Semiconductor element 3 is soldered on copper plate 2. Conductive layers 4 and 5 made of copper plates are adhered to the surface of insulating layer 1 on the both sides of copper plate 2. Electrodes 6 and 7 are formed on semiconductor element 3 and electrically connected to conductive layers 4 and 5, respectively, by fine wires 8 and 9 made of metal, by means of a known wire bonding method or a ultrasonic bonding method. Terminals C, E, and G are adhered to the conductive layers, i.e., copper plates 2, 4, and 5.

In general, the above-mentioned element is sealed within resin, in the final manufacturing step, to protect the element from atmosphere and moisture. FIG. 1B is a perspective view of the final product, in which terminals C, E, and G protrude from the rectangular sealing resin layer. The emitter of semiconductor element 3 is connected to terminal E, the gate thereof to terminal G, and the collector thereof to terminal C, for example, as shown in FIG. 1C illustrating an insulated gate bipolar transistor (IGBT). In this way, high-power semiconductor device 11 is formed.

As shown in FIGS. 2A and 2B, to prevent failure of the device, which may be caused by an overcurrent flowing through the semiconductor element, resistor 12 (see FIG. 2A) or current transformer 13 (see FIG. 2B) is electrically connected to high power semiconductor device 11 enclosed by broken lines, and detects a current. In FIGS. 2A and 2B, reference symbols L and V denote a load and a power source, respectively.

The result of the detection of a current flowing through resistor 12 o current transformer 13 is fed back to a drive circuit (not shown) connected to high power semiconductor device 11, to shut off or reduce the current if an overcurrent is detected.

When resistor 12 detects a current as is shown in FIG. 2A, power of the product of the square of the current and the resistance is lost. To suppress such a loss of power, a resistor having considerably low resistance is used in general. However, a low resistance resistor is not easily available and expensive. In addition, the resistor must be large, so as to withstand to Joule heat generated in the resistor.

On the other hand, since current detection by means of current transformer 13 as is shown in FIG. 2B causes no power loss, the method is widely applied to a high power semiconductor device. However, it is very difficult for current transformer 13 to detect a direct current perfectly. Further, the transformer must be large enough to detect some kind of pulse, and may therefore be expensive.

As described above, the conventional method of detecting a current is disadvantageous in that an external element for detecting an overcurrent must be connected thereto, and the element is expensive. Moreover, since an external element must be used, the entire system including the semiconductor device tends to be large and difficult to handle.

SUMMARY OF THE INVENTION

Accordingly, an object of the present invention is to provide a high-power semiconductor device which requires no external elements for detecting a current.

Another object of the present invention is to provide an inexpensive and compact high-power semiconductor device which can generate an overcurrent detecting signal.

These objects can be achieved by a high-power semiconductor device comprising a plurality of conductive layers selectively adhered to a surface of an insulating substrate, a semiconductor element having a plurality of electrodes connected to the conductive layers, terminals electrically connected to the electrodes, and a sealing resin layer covering the above-mentioned components, the semiconductor device further comprising an overcurrent detecting terminal, and characterized in that at least one of the conductive layers has at least a portion which is thinner than the other conductive layers, the terminals for one of the electrodes is connected to an end of the conductive layer having a thinner portion, and the overcurrent detecting terminal is electrically connected to said one of the electrodes and to the other end of the conductive layer having a thinner portion.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1A is a perspective view showing a primary portion of a conventional high-power semiconductor device;

FIG. 1B is a perspective view showing an exterior of the conventional high-power semiconductor device sealed with resin;

FIG. 1C is a diagram showing an equivalent circuit of the conventional high power semiconductor device;

FIG. 3 is a perspective view showing a step of assembling a high power semiconductor device according to a first embodiment of the present invention.

DETAILED DESCRIPTION OF THE PREFERRED EMBODIMENTS

Figure 2A:
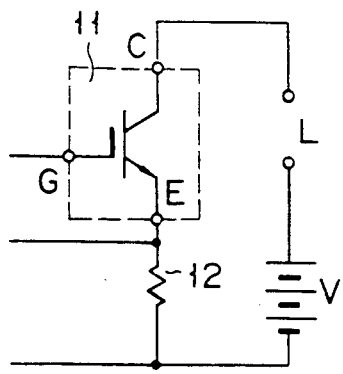
FIGS. 2A and 2B are diagrams showing equivalent circuits of conventional devices for detecting an overcurrent.
Figure 2B:
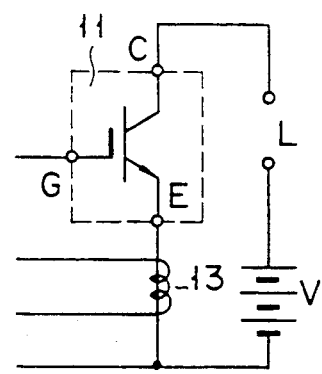

Embodiments of the present invention will now be described with reference to the accompanying drawings.

In a first embodiment of the invention shown in FIG. 3, assembly 16 has terminal E (emitter), terminal C (collector), terminal G (gate), and overcurrent detecting terminal T, all of which are attached to sealing resin plate 28. Conductive layers, for example, copper plates, 19, 20, 21 and 22 are adhered to an insulating substrate, or ceramic substrate 18 formed of alumina and aluminum nitride. At least one of the conductive layers is thinner than the others. In a first embodiment, layer 22 is thinner than the others. Conductive layers 19, 20, 21 and 22 are adhered to ceramic substrate 18 by a direct bonding method, i.e., cuprous oxide plates are heated and adhered to ceramic substrate, thereby forming conductive layers 19, 20, 21 and 22. Alternatively, the conductive layers can be formed of metallized layers, or can be formed by a screen printing method. It is desirable that thicker conductive layers 19, 20 and 21 be 0.5 to 0.3 mm thick and thinner conductive layer 22 be 10 to 100 μm thick.

Semiconductor element 23, for example, an insulated gate bipolar transistor (IGBT) for use in a high power device, is mounted on conductive layer 19 by soldering.

The IGBT is only an example of various semiconductor elements, and can be replaced by other high power semiconductor devices such as high-power Darlington transistor, a high power transistor thyristor, or a power MOS transistor.

Gate electrode 24 and emitter electrode 25 are formed on the surface of high-power semiconductor element 23. (The top face of semiconductor element 23 generally has an insulating layer or a conductive metal layer formed thereon, so these layers are referred to as "the surface".) The electrodes in the present invention are electrically connected to areas isolated by PN junctions which are formed by injecting or diffusing a predetemined amount of impurities into the silicon substrate, for example.

Gate electrode 24 and emitter electrode 25 are respectively connected to conductive layers 20 and 21 having the same thickness by metallic fine wires 26 and 27 by an ultrasonic bonding method or a thermocompression bonding method. Copper plate 19 is soldered with high-power semiconductor element 23, and serves as a collector electrode of a bipolar transistor.

As shown in FIG. 3, terminal G for gate electrode 24, terminal E for emitter electrode 25, collector terminal C for collector electrode and overcurrent detecting terminal T are fixed to sealing resin plate 28, thus constituting assembly 16. Hence, positions of these terminals on the conductive layers can be accurately determined. Terminal T is so shaped as to be connected to both of thinner conductive layer 22 and thicker conductive layer 21 which is connected to emitter electrode 25 by metallic fine wire 27. Thus, terminal T consists of metal plate portion 29 which is as wide as the distance between conductive layers 21 and 22 plus the widths of layers 21 and 22, and lead-in portion 30 which is narrower than metal plate portion 29. Terminals G, E and C are simultaneously brought into contact with copper plates 20, 22 and 19, and soldered thereto. At the same time, metal plate portion 29 of terminal T is soldered to conductive layers 21 and 22.

In the above structure, since the electrodes of the semiconductor element are connected to the corresponding conductive layers by the metallic fine wires, each potential of the electrodes is derived by terminal E, G or T to the exterior of the semiconductor device. Further, terminal T connected to conductive layers 21 and 22 has the same potential as that of electrode 25 which is electrically connected to these conductive layers 21 and 22. Layer 22 has a resistance such that Joule heat generated is negligibly low, but the current can be detected, that is, one to several tens of mΩ in accordance with the rating of the current. Hence, a voltage corresponding to the current flowing through the conductive layers is detected as a potential difference between emitter terminal E and overcurrent detecting terminal T. Since the thinner conductive layer serving as a resistor is formed on the insulating substrate having a relatively high heat conductivity, Joule heat generated from the thinner conductive layer is easily dissipated to the substrate.

After terminals C, E, G and T have been soldered to the conductive layers, the above-mentioned structure is sealed with resin, to protect the semiconductor element from external atmosphere and moisture. The configuration of the device finally obtained is similar to that of the conventional device as shown in FIG. 1B.

Figure 4:
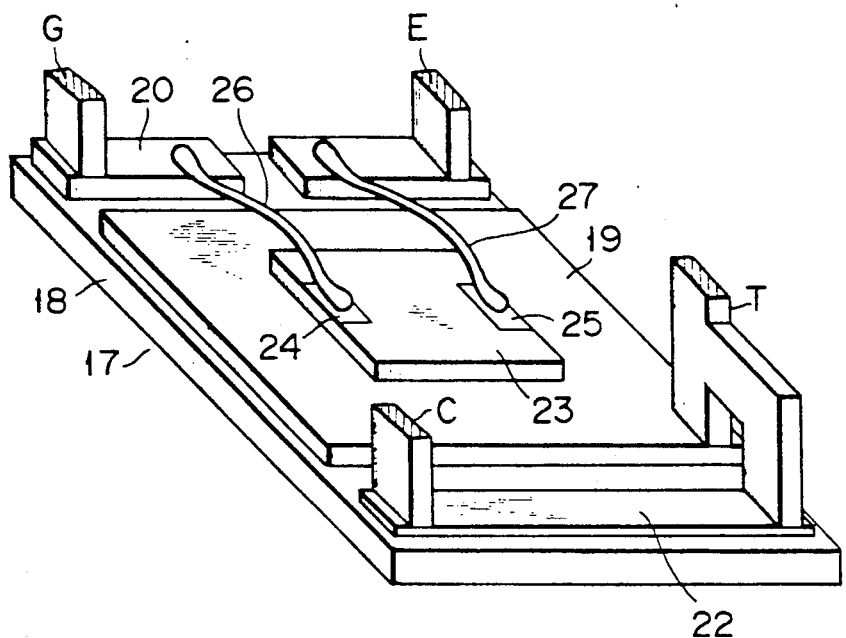
FIGS. 4, 5, and 6 are perspective views showing a high power semiconductor device according to a second, third, and fourth diment of the present invention, respectively.

FIG. 4 shows a second embodiment of the present invention, which differs from the embodiment shown in FIG. 3 in that terminal C for collector electrode is connected to one of the end portions of thinner conductive layer 22. Overcurrent detecting terminal T is connected across conductive layer 19 and another end portions of thinner conductive layer 22. In the same manner as in the embodiment shown in FIG. 3, the overcurrent flowing through the collector circuit can be detected by measuring the voltage across terminal C and overcurrent detecting terminal T.

Figure 5:
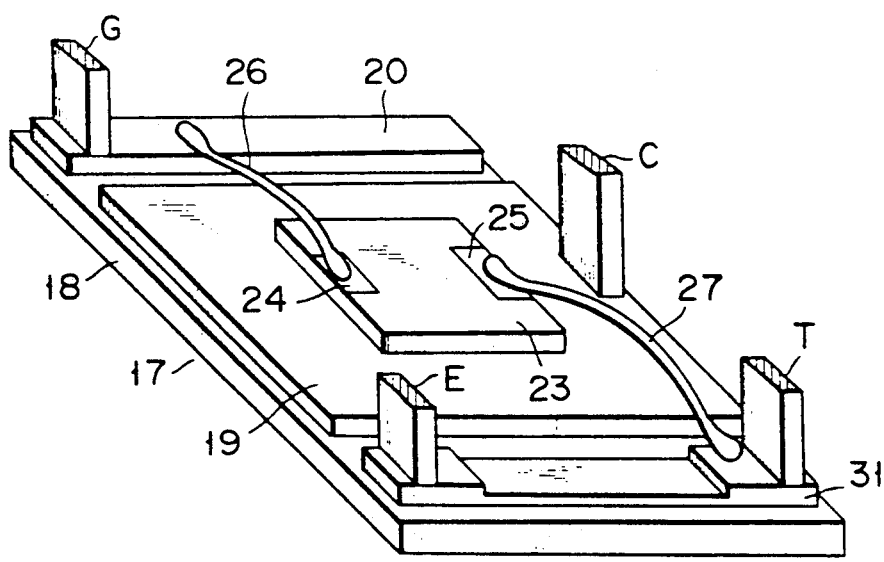

FIG. 5 shows a third embodiment of the present invention. In this embodiment, a center portion of thick conductive layer 31 is thinner than both end portions. Emitter electrode 25 of semiconductor element 23 is connected to one of the end portions, i.e. the thicker portions of conductive layer 31, by metallic fine wire 27. Overcurrent detecting terminal T is soldered also to the same portion. Terminal E is soldered to the other end portion of conductive layer 31. In this structure, an overcurrent is detected by measuring the voltage across terminals T and E connected to the end portions of conductive layer 31, in the same manner as in the embodiment shown in FIG. 3. Metallic fine wire 27 is directly bonded to the above mentioned thicker portion of conductive layer 31. The resistance of conductive layer 31 is determined by the length of the thinner portion, so that the resistance is not changed due to the displacement of the connecting point of the fine wire.

Figure 6:
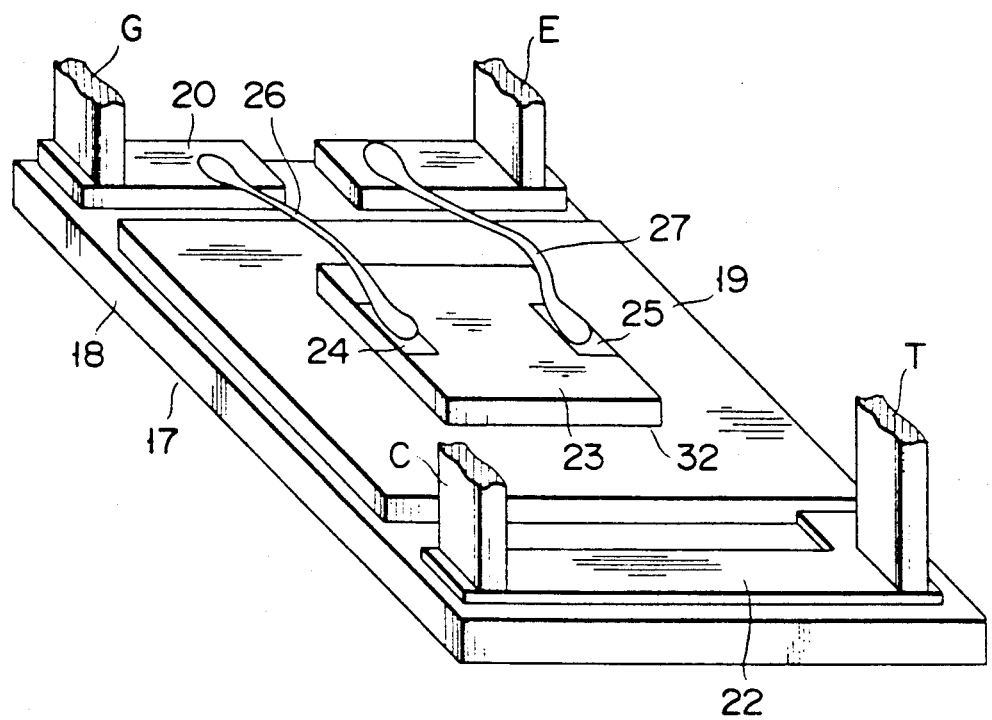

FIG. 6 shows a fourth embodiment of the present invention. In this embodiment, conductive layer 22 thinner than the other conductive layers is connected to or formed integral with thicker conductive layer 19. In other words, an end of conductive layer 22 is connected to the a portion of conductive layer 19 on which semiconductor element 23 is mounted. Overcurrent detecting terminal T is connected to an end portion of conductive layer 22, which is connected to thicker conductive layer 19. Terminal C for a electrode is connected to the other end portion of conductive layer 22.

In FIGS. 4, 5, and 6 the elements common to those shown in FIG. 3 are identified with like numerals, and the descriptions of those elements are not repeated here.

In the above-described embodiments, the overcurrent detection terminal is derived to the exterior of the sealing resin layer. However, if a monolithic or a hybrid semiconductor element incorporating a feedback circuit for detecting and controlling current is used, it is unnecessary that the overcurrent detecting terminal be derived to the exterior of the sealing resin layer. Further, in the above embodiments, only one thinner conductive layer is formed on the substrate; however, if a plurality of semiconductor elements are formed, one thinner conductive layer may be formed with respect to one semiconductor element, and therefore, a plurality of thinner conductive layers can be formed on the substrate.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A high-power semiconductor device comprising:
    a plurality of conductive layers selectively adhered to a surface of an insulating substrate, including first and second conductive layers;
    a semiconductor element having a plurality of electrodes connected to the conductive layers;
    a group of terminals electrically connected to the electrodes; and
    a sealing resin layer covering said conductive layers and the semiconductor element,
    said semiconductor device further comprising an overcurrent detecting terminal, and characterized in that:
    the first conductive layer has a portion that is thinner in cross-section than the second conductive layer;
    one of the group of terminals for the electrodes is connected to a first end of said one of the first and second conductive layers; and
    said overcurrent detecting terminal is electrically connected to a second end opposite the first end of one of the first and second conductive layers.

2. A high-power semiconductor device according to claim 1, wherein:
    said overcurrent detecting terminal is connected, to both the second conductive layer and a first end of said first conductive layer; and
    one of said group of terminals is connected to a second end of the first conductive layer, opposite to the first end.

3. A high-power semiconductor device according to claim 1, wherein:
    said overcurrent detecting terminal is electrically connected to a conductive layer formed on the surface of the substrate and on which said semiconductor element is mounted, and is also electrically connected to a first end of said first conductive layer; and
    a terminal for the electrode of said semiconductor element which is attached to the substrate is connected to a second end of said conductive layer opposite the first end, the entire region of which is thinner than the other conductive layers.

4. A high-power semiconductor device according to claim 1, further including a metallic fine wire, the first conductive layer having a thinner mid-portion and thicker portions at opposite ends thereof;
    said overcurrent detecting terminal and the metallic fine wire being connected to one of the thicker portions of said first conductive layer, the wire also being connected to one of the electrodes; and
    one of the group of terminals is connected to an end of the first conductive layer opposite to the end on which the overcurrent detecting terminal is connected.

5. A high-power semiconductor device according to claim 1, wherein the semiconductor element is mounted on one of the plurality of conductive layers, and the first layer has a substantially uniform thickness throughout, an end of said first conductive layer being connected to a portion of the conductive layer on which said semiconductor element is mounted, said overcurrent detecting terminal being connected to an end portion of the first conductive layer, and a terminal for an electrode being connected to an end of the first conductive layer opposite to the end connected to the conductive layer upon which the semiconductor element is mounted.

6. A high-power semiconductor device according to claim 1, 2, 3, 4, or 5, wherein said group of terminals and the overcurrent detecting terminal are adhered to the sealing resin layer.

7. A semiconductor device comprising:
    first and second conductive layers adhered to a substrate, the first layer having a portion which has a cross-sectional area less than a cross-sectional area of the second layer;
    a semiconductor element having an electrode connected to one of the conductive layers;
    a first terminal, connected to one of the conductive layers; and
    a second terminal for detecting overcurrent, electrically connected to both the first and second conductive layers.

8. A semiconductor device as set forth in claim 7 wherein a thickness of the entire first conductive layer is less than a thickness of the entire second conductive layer.

9. A semiconductor device as set forth in claim 7 wherein the first terminal contacts the first conductive layer.

10. A semiconductor device as set forth in claim 7 wherein the first conductive layer has distal end portions and an intermediate portion connecting the distal end portions, the intermediate portion having a thickness less than a thickness of the distal end portions.

11. A semiconductor device as set forth in claim 7 wherein the first and second terminals contact the first conductive layer, the first conductive layer being electrically connected to the second conductive layer.

12. A semiconductor device as set forth in claim 7 wherein the portion of the first layer has a thickness of between about 10 and 100 $\mu$m and the second layer has a thickness of between about 0.3 and 0.5 mm.

* * * * *